United States Patent
Shepard et al.

(10) Patent No.: US 9,741,870 B2
(45) Date of Patent: Aug. 22, 2017

(54) SYSTEMS AND METHODS FOR CMOS-INTEGRATED JUNCTION FIELD EFFECT TRANSISTORS FOR DENSE AND LOW-NOISE BIOELECTRONIC PLATFORMS

(71) Applicant: The Trustees of Columbia University in the City of New York, New York, NY (US)

(72) Inventors: Kenneth L. Shepard, Ossining, NY (US); Jacob Rosenstein, New York, NY (US); Ryan Michael Field, New York, NY (US); Dan Fleischer, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 14/681,753

(22) Filed: Apr. 8, 2015

(65) Prior Publication Data

US 2015/0214384 A1 Jul. 30, 2015

Related U.S. Application Data

(63) Continuation of application No. PCT/US2013/065478, filed on Oct. 17, 2013.
(Continued)

(51) Int. Cl.
*H01L 29/808* (2006.01)
*H01L 29/06* (2006.01)
(Continued)

(52) U.S. Cl.
CPC .......... *H01L 29/808* (2013.01); *H01L 21/762* (2013.01); *H01L 21/8232* (2013.01);
(Continued)

(58) Field of Classification Search
CPC ......... H01L 27/14679; H01L 29/66431; H01L 29/66893; H01L 29/7832; H01L 29/8086
See application file for complete search history.

(56) References Cited

U.S. PATENT DOCUMENTS 5,872,493 A 2/1999 Ella
7,221,242 B2 5/2007 Asai et al.
(Continued)

FOREIGN PATENT DOCUMENTS

CN 1449110 10/2003
CN 1652458 8/2005
(Continued)

OTHER PUBLICATIONS

U.S. Appl. No. 13/283,670, filed Oct. 28, 2011 (Jun. 28, 2012).
(Continued)

*Primary Examiner* — Jae Lee
(74) *Attorney, Agent, or Firm* — Baker Botts L.L.P.

(57) ABSTRACT

A complementary metal oxide semiconductor (CMOS)-integrated junction field effect transistor (JFET) has reduced scale and reduced noise. An exemplary JFET has a substrate layer of one dopant type with a gate layer of that dopant type disposed on the substrate, a depletion channel of a second dopant type disposed on the first gate layer, and a second gate layer of the first dopant type disposed on the depletion channel and proximate a surface of the transistor. The second gate layer can separate the depletion channel from the surface, and the depletion channel separates the first gate layer from the second gate layer.

14 Claims, 8 Drawing Sheets

Related U.S. Application Data

(60) Provisional application No. 61/715,193, filed on Oct. 17, 2012.

(51) Int. Cl.

| | | |
|---|---|---|
| *H01L 21/762* | (2006.01) | |
| *H01L 21/8232* | (2006.01) | |
| *H01L 27/098* | (2006.01) | |
| *H01L 29/423* | (2006.01) | |
| *H01L 29/66* | (2006.01) | |

(52) U.S. Cl.
CPC ........ *H01L 27/098* (2013.01); *H01L 29/0696* (2013.01); *H01L 29/42316* (2013.01); *H01L 29/66893* (2013.01); *H01L 29/0649* (2013.01)

(56) References Cited

U.S. PATENT DOCUMENTS

| | | |
|---|---|---|
| 7,670,889 B2 | 3/2010 | Pekarik et al. |
| 7,943,445 B2 | 5/2011 | Anderson et al. |
| 8,525,619 B1 | 9/2013 | Olsson et al. |
| 2003/0015941 A1 | 1/2003 | Nakatani et al. |
| 2003/0199105 A1 | 10/2003 | Kub et al. |
| 2004/0135144 A1 | 7/2004 | Yamada et al. |
| 2006/0125489 A1 | 6/2006 | Feucht et al. |
| 2006/0137453 A1 | 6/2006 | Wu et al. |
| 2006/0139122 A1 | 6/2006 | Asai |
| 2006/0185139 A1 | 8/2006 | Larson, III et al. |
| 2006/0202779 A1 | 9/2006 | Fazzio et al. |
| 2006/0214747 A1 | 9/2006 | Lakin |
| 2007/0007851 A1 | 1/2007 | Loebl et al. |
| 2007/0210349 A1 | 9/2007 | Lu et al. |
| 2008/0026515 A1* | 1/2008 | El-Kareh ............ H01L 29/0642 438/186 |
| 2008/0272408 A1 | 11/2008 | Vora |
| 2011/0027930 A1 | 2/2011 | El-Gamal et al. |
| 2012/0292669 A1* | 11/2012 | Candra ................. H01L 29/808 257/268 |
| 2013/0001656 A1* | 1/2013 | El-Kareh ............ H01L 29/8086 257/263 |

FOREIGN PATENT DOCUMENTS

| | | |
|---|---|---|
| CN | 101246162 | 8/2008 |
| EP | 1959568 | 8/2008 |
| WO | WO 00/68419 | 11/2000 |
| WO | WO 2004/061972 | 7/2004 |
| WO | WO 2008/101646 | 8/2008 |
| WO | WO 2010/123712 | 10/2010 |
| WO | WO 2010/127122 | 11/2010 |

OTHER PUBLICATIONS

U.S. Appl. No. 13/283,670, Jun. 24, 2014 Non-Final Office Action.
U.S. Appl. No. 13/283,670, Dec. 18, 2014 Response to Non-Final Office Action.
U.S. Appl. No. 13/283,670, Feb. 18, 2015 Final Office Action.
U.S. Appl. No. 13/283,670, Jun. 5, 2015 Response after Final Action.
U.S. Appl. No. 13/283,670, Jun. 9, 2015 Applicant Initiated Interview Summary.
U.S. Appl. No. 13/283,670, Aug. 18, 2015 Amendment and Request for Continued Examination (RCE).
U.S. Appl. No. 13/283,670, Oct. 1, 2015 Notice of Allowance.
Abdolvand, et al., "ZNO-on-nanocrystalline diamond lateral bulk acoustic resonators", IEEE 20th International Conference on Micro Electro Mechanical Systems, 2007. MEMS., (2007), 795-798.
Brederlow, et al., "Biochemical sensors based on bulk acoustic wave resonators", IEEE International Electron Devices Meeting, 2003. IEDM '03 Technical Digest., (2003), 32.7.1-32.7.3.
Caillat, et al., "Biochips on CMOS: An Active Matrix Address Array for DNA Analysis", Sensors and Actuators B: Chemical, vol. 61, Issues 1-3, Dec. 14, 1999, pp. 154-162.
Canadian Application Serial No. 2,760,508, Amendment filed Oct. 28, 2011, 6 pgs.
Canadian Application Serial No. 2,760,508, Office Action mailed Feb. 14, 2013, 2 pgs.
Canadian Application Serial No. 2,760,508, Response filed Aug. 14, 2013 to Office Action mailed Feb. 14, 2013, 14 pgs.
Chinese Application Serial No. 201080018971.9, Office Action mailed Mar. 20, 2014, w/ English translation, 6 pgs.
Chinese Application Serial No. 201080018971.9, Office Action mailed Jul. 2, 2013, w/ English translation, 18 pgs.
Chinese Application Serial No. 201080018971.9, Office Action mailed Dec. 5, 2013, w/ English translation, 19 pgs.
Chinese Application Serial No. 201080018971.9, Response filed Feb. 20, 2014 to Office Action mailed Dec. 5, 2013, w/ English claims, 11 pgs.
Chinese Application Serial No. 201080018971.9, Response filed Nov. 18, 2013 to Office Action mailed Jul. 2, 2013, w/ English claims, 10 pgs.
Clark, et al., "High-Q VHF micromechanical contour-mode disk resonators", Technical Digest, International Electron Devices Meeting, 2000. IEDM '00., (2000), 493-496.
European Application Serial No. 10770334.0, Extended European Search Report mailed Apr. 24, 2014, 6 pgs.
Gabl, et al., "First results on label-free detection of DNA and protein molecules using a novel integrated sensor technology based on gravimetric detection principles", Biosensors and Bioelectronics, 19(6), (Jan. 15, 2004), 615-620.
International Application Serial No. PCT/US10/32976, Search Report mailed Aug. 4, 2010, 8 pgs.
International Application Serial No. PCT/US10/32976, Written Opinion mailed Aug. 4, 2010, 8 pgs.
International Search Report dated Mar. 19, 2014 in International Application No. PCT/US13/65478.
Johnston, et al., "FBAR-CMOS Oscillator Array for Mass-Sensing Applications", IEEE Sensors Journal, vol. 10, No. 6, (Jun. 2010), 1042-1047.
Lee, et al., "Deposition of ZnO thin films by magnetron sputtering for a film bulk acoustic resonator", Thin Solid Films, 435(1-2), (Jul. 1, 2003), 179-185.
Otis, et al., "A 300µW 1.9GHz CMOS Oscillator Utilizing Micromachined Resonators", Proceedings of the 28th European Solid-State Circuits Conference, 2002. ESSCIRC 2002., (2002), 151-154.
Piazza, "MEMS Resonators for Frequency Control and Sensing Applications", [Online]. Retrieved from the Internet: <URL: http://www.ifcs-eftf2011.org/sites/ifcs-eftf2011.org/files/editor-files/Slides_Piazza.pdf>, (Accessed Apr. 30, 2014), 104 pgs.
Rinaldi, et al., "AIN contour-mode resonators for narrow-band filters above 3 GHz", IEEE International Frequency Control Symposium, 2009 Joint with the 22nd European Frequency and Time forum., (2009), 70-74.
Shi, et al., "A Cost-Competitive High Performance Junction-FET (JFET) in CMOS Process for RF and Analog Applications", RFIC 2010, May 2010, pp. 237-240.
Takao, et al., "A JFET-CMOS Technology for Low-Noise Sensor Interface Circuits", IEEJ Transactions on Sensors and Micromachines, vol. 123, Issue 10, pp. 422-428.
Takao, et al., "Low-Noise Fully Differential Amplifiers Using JFET-CMOS Integration Technology for Smart Sensors", IEEJ Transactions on Electrical and Electronic Engineering, vol. 3, Issue 3, pp. 274-280.

\* cited by examiner

SYSTEMS AND METHODS FOR CMOS-INTEGRATED JUNCTION FIELD EFFECT TRANSISTORS FOR DENSE AND LOW-NOISE BIOELECTRONIC PLATFORMS

CROSS REFERENCE TO RELATED APPLICATION

This application is a continuation of PCT/US/13/065478, filed Oct. 17, 2013, and which claims priority to U.S. Provisional Patent Application No. 61/715,193, filed Oct. 17, 2012, both of which are incorporated by reference herein in their entireties.

STATEMENT REGARDING FEDERALLY SPONSORED RESEARCH

This invention was made with government support under Award No. R33-HG003089 awarded by the National Institute of Health. The government has certain rights in the invention.

BACKGROUND

Compact electronic systems that interface with biophysical systems can be suitably sensitive to detect even weak signals of such systems without introducing measurement inaccuracies. Signal weakness can increase the effects of measurement noise and, as such, integrated circuit components that minimize measurement noise can be beneficial. A source of such noise can be irregularities in the physical structure found in certain electronic components. These irregularities can produce unpredictable measurement fluctuations called 1/f or flicker noise. Flicker noise can vary inversely as to the area of a transistor and, as such, can affect electronic interfaces to biophysical systems having highly dense transistor arrays.

Flicker noise can be considered a generic name for fluctuations whose power spectral density scales with frequency as $S_N(f) \propto 1/f$. Flicker noise can come from a number of physical sources, such as from inhomogeneous structures that fluctuate unpredictably over time. In integrated electronics, flicker noise can arise from traps in interfaces between materials, semiconductor dopants, and material defects.

Flicker noise can decrease as the size of an element increases, and the increasing number of individual point defects can reduce or inhibit each other. Integrated electronics can be generally planar, and thus flicker noise power can be inversely proportional to the area (W×L) of a transistor.

Certain applications involving electronic interfaces to biophysical systems can include measuring weak signals with fine spatial resolution, high channel count, and low cost. Yet these can be competing goals, at least in part, because reducing the dimensions of electronic elements can yield higher noise levels, which in turn can impact a wide range of applications, including biochemical assays and sequencing platforms, neural recording arrays, and advanced imagers and particle detector readout arrays.

In these and other applications, large arrays on a fine pitch can be desirable, yet the signals can be weak and thus reduced electronic measurement noise can be desirable. Electronic components can contain a range of structural irregularities such as interface traps, dopant inhomogeneity, and material defects. These irregularities can cause unpredictable electrical fluctuations, such as flicker noise.

Junction Field Effect Transistors (JFETs) can exhibit lower levels of flicker noise than other transistor designs at least in part because of their construction. A JFET can achieve a noise target comparable to that of a Metal Oxide Field Effect Transistor (MOSFET) while occupying an area 20 times as small.

Accordingly, there is an opportunity for improved JFET transistors, including CMOS-integrated JFET transistors that can be suitable for dense and low-noise bioelectronic platforms.

SUMMARY

The disclosed subject matter provides for complementary metal oxide semiconductor (CMOS)-integrated junction field effect transistors (JFETs), including JFETs integrated with CMOS.

The disclosed subject matter provides an integrated low-noise Junction Field Effect Transistor (JFET) design that can be fabricated using standard CMOS technology. JFETs can achieve lower flicker noise targets than integrated Metal Oxide Semiconductor Field Effect Transistors (MOSFETs) for similarly sized components. JFETs according to the disclosed subject matter can thus be used to construct dense low-noise sensor interface arrays. JFETs according to the disclosed subject matter can reduce the complexity of electronic systems by reducing or eliminating the need to employ noise reduction techniques.

In an exemplary embodiment, a method for reducing noise in a JFET implemented in CMOS-technology is provided. The JFET can include a top gate and source and drain contacts, and the method can include removing shallow trench isolation (STI) from an area between a top gate and the source and drain contacts to reduce flicker noise.

In some embodiments, a method includes implementing a JFET in CMOS with independent top and bottom gates, which can allow implementation of an interdigitated JFET transistor differential pair. In some embodiments, the method can include switched-biasing and/or correlated double sampling of the JFET.

Systems and methods according to the disclosed subject matter can allow for applications involving electronic interfaces to biophysical systems, which can involve measuring weak signals with fine temporal resolution, high channel count and low cost. Such applications can include, for example and without limitation, biochemical assays and sequencing platforms, neural recording arrays and imagers and particle detector readout arrays. The disclosed subject matter can also be used to implement a JFET-CMOS architecture for dense, low-noise sensor interface arrays.

BRIEF DESCRIPTION OF THE DRAWINGS

The accompanying drawings, which are incorporated and constitute part of this disclosure, illustrate some embodiments of the disclosed subject matter.

DETAILED DESCRIPTION

Junction field-effect transistors can provide low gate leakage current, low white voltage noise, and low flicker noise. One integrated-circuit alternative can be a MOS transistor, which can have negligible gate current and increased white noise, but an increased flicker voltage noise.

According to one aspect of the disclosed subject matter, a low-noise CMOS-integrated n-channel JFET device is provided, with current noise up to $4 \times 10^{-18}$ A$^2$/Hz at f=1 Hz with $\alpha$=−1.03 (1/f$^\alpha$). An exemplary JFET device can be implemented, for example and without limitation, in an IBM 0.18 µm CMOS technology. Certain CMOS JFET designs can be configured for high-voltage operation up to 8 volts between device terminals, but can have unsuitable noise performance due at least in part to the presence of shallow trench isolation (STI) in the vicinity of the JFET channel. In an exemplary JFET of the disclosed subject matter, without any process modifications, the STI can be removed from the junction regions. As illustrated herein, such a modification can decrease the drain current flicker noise power by a factor of 100 or more.

Figure 1:
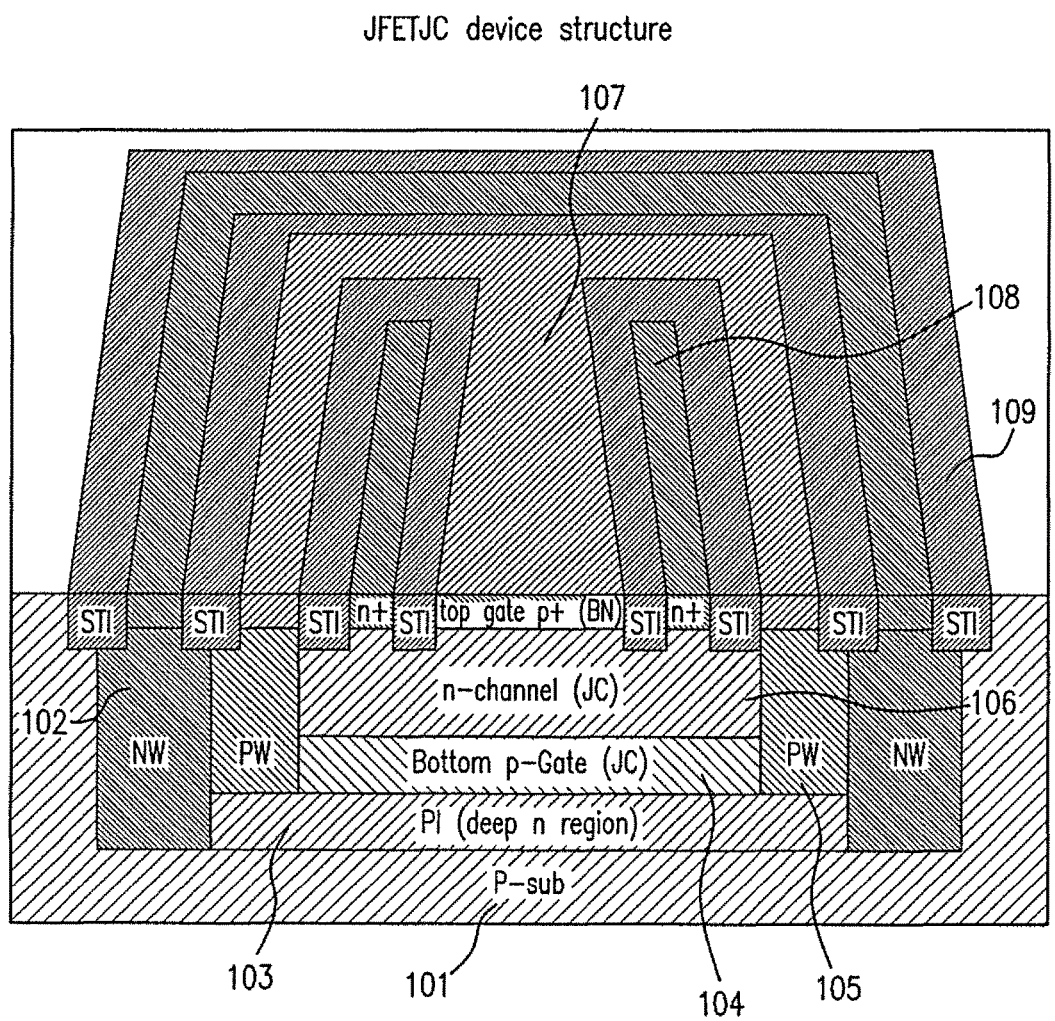
FIG. 1 is a diagram illustrating an exemplary JFETJC device structure.
Figure 2:
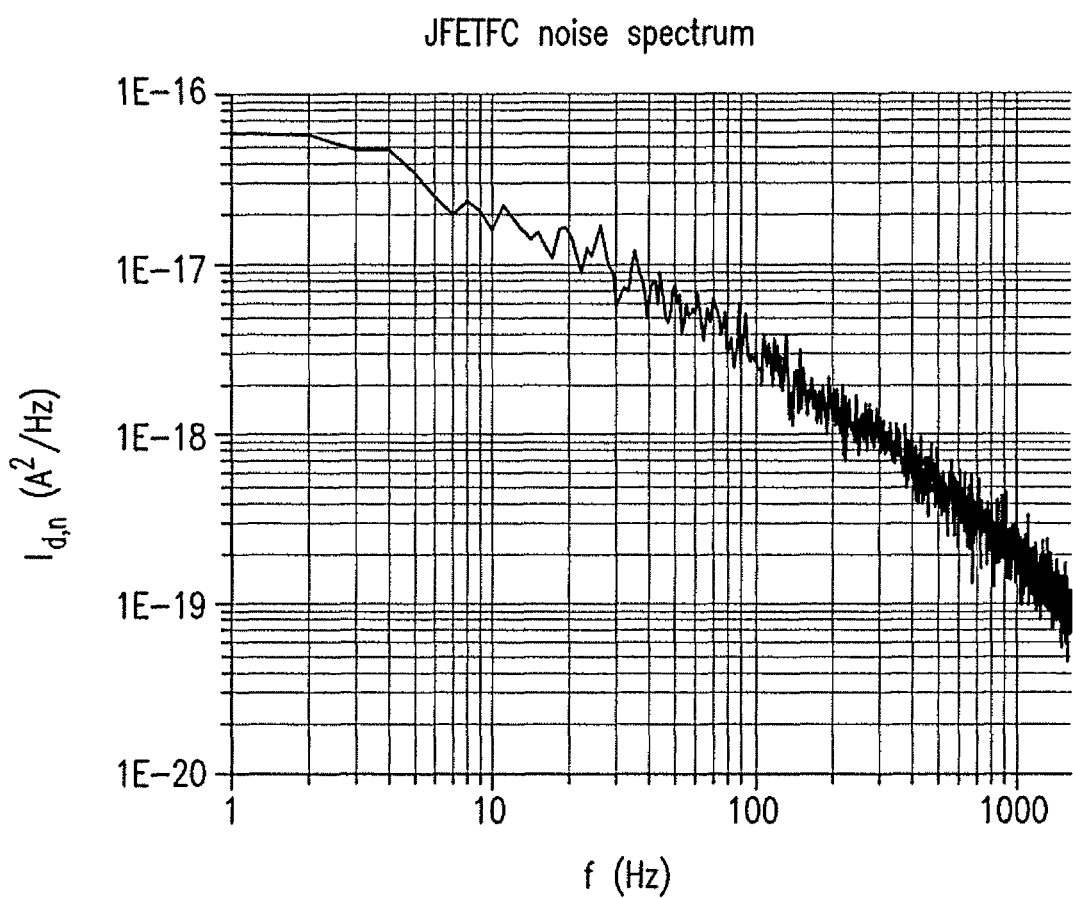
FIG. 2 is a diagram illustrating an exemplary JFETJC noise spectrum.

For purpose of comparison to the disclosed subject matter, a conventional JFET structure, known as JFETJC, is shown in FIG. 1. The transistors use two additional mask levels (PI 103, which defines the n-type triple well, and JC, which defines the JFET channel 106 and p-type inner well 104) to construct a full n-channel JFET in IBM's 0.18 µm process. As shown in FIG. 1, this device has STI regions 109 in the vicinity of the channel. These silicon dioxide interfaces near the channel can produce charge trapping, which can degrade the device flicker noise performance. The measured noise performance of this device is shown in FIG. 2 for a width of 320 µm and length of 500 nm.

Figure 3:
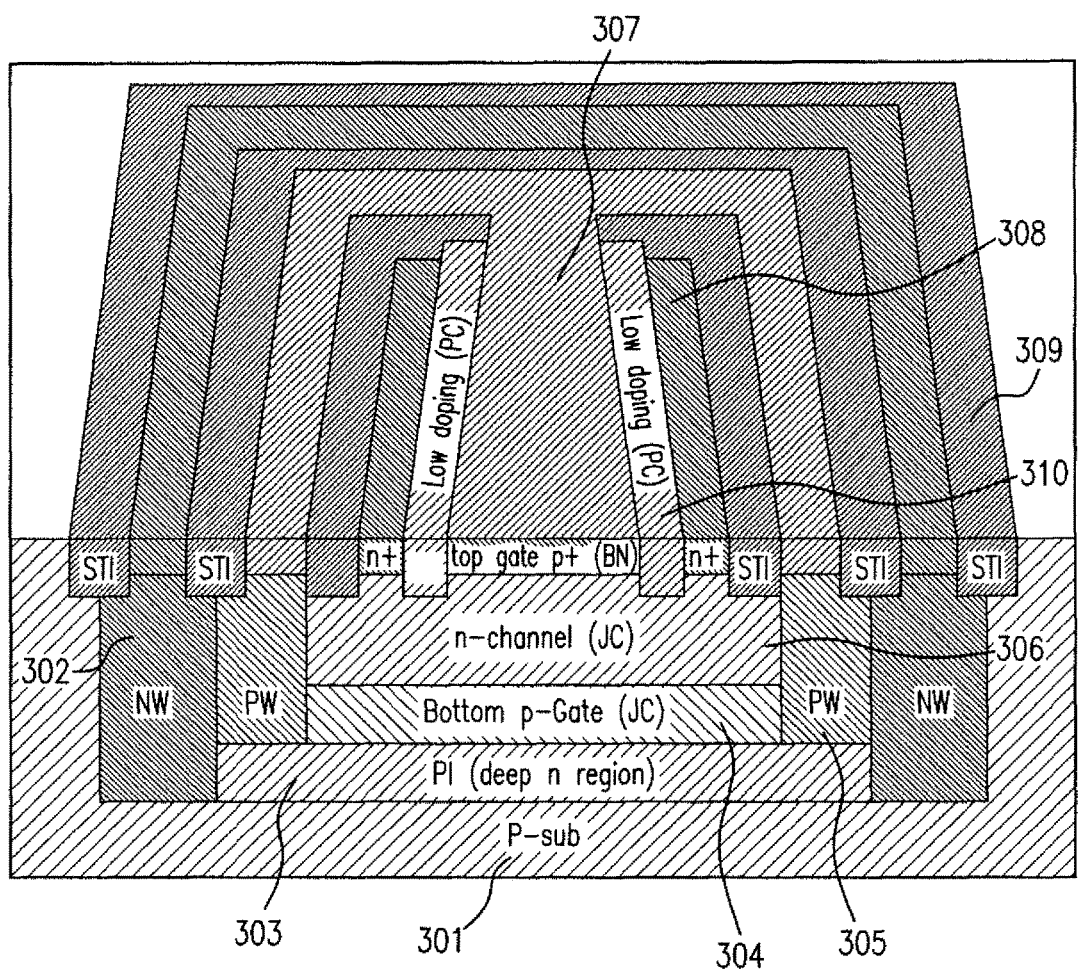
FIG. 3 is a diagram illustrating an exemplary Modified JFET device structure according to the disclosed subject matter.
Figure 4:
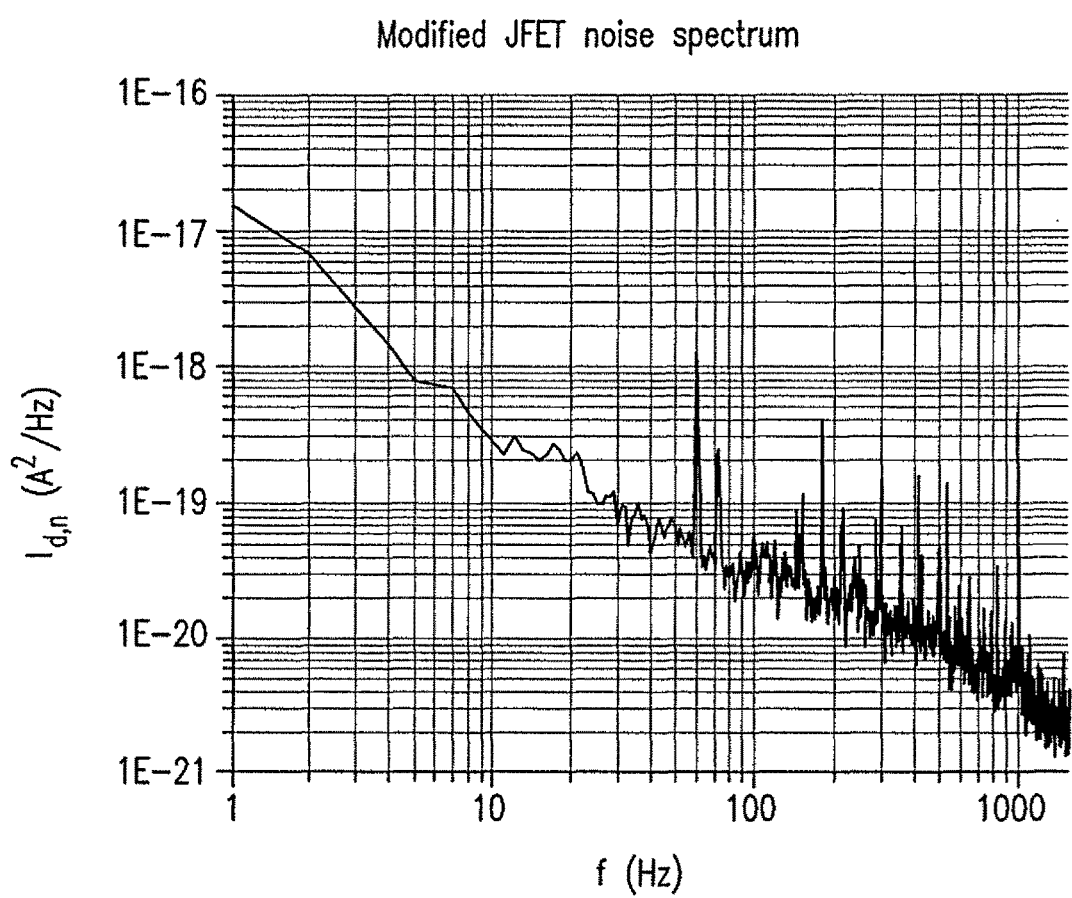
FIG. 4 is a diagram illustrating an exemplary Modified JFET noise spectrum according to the disclosed subject matter.

Referring to FIG. 3, an exemplary JFET structure will be described. In accordance with the disclosed subject matter, shallow trench isolation (STI) 309 can be removed from the devices with the addition of a blocking layer, for example and embodied herein as a polysilicon (PC) layer 310, to replace the STI. As embodied herein, PC can act as a blocking layer, thereby breaking the conductive salicide that can be present to reduce the diffusion contact resistances. PC can also block the dopant implant between the source gate and drain of the transistor, as shown for example in FIG. 3. The flicker noise spectrum of the exemplary JFET device is shown in FIG. 4 at the same device geometry and biasing conditions.

Figure 5:
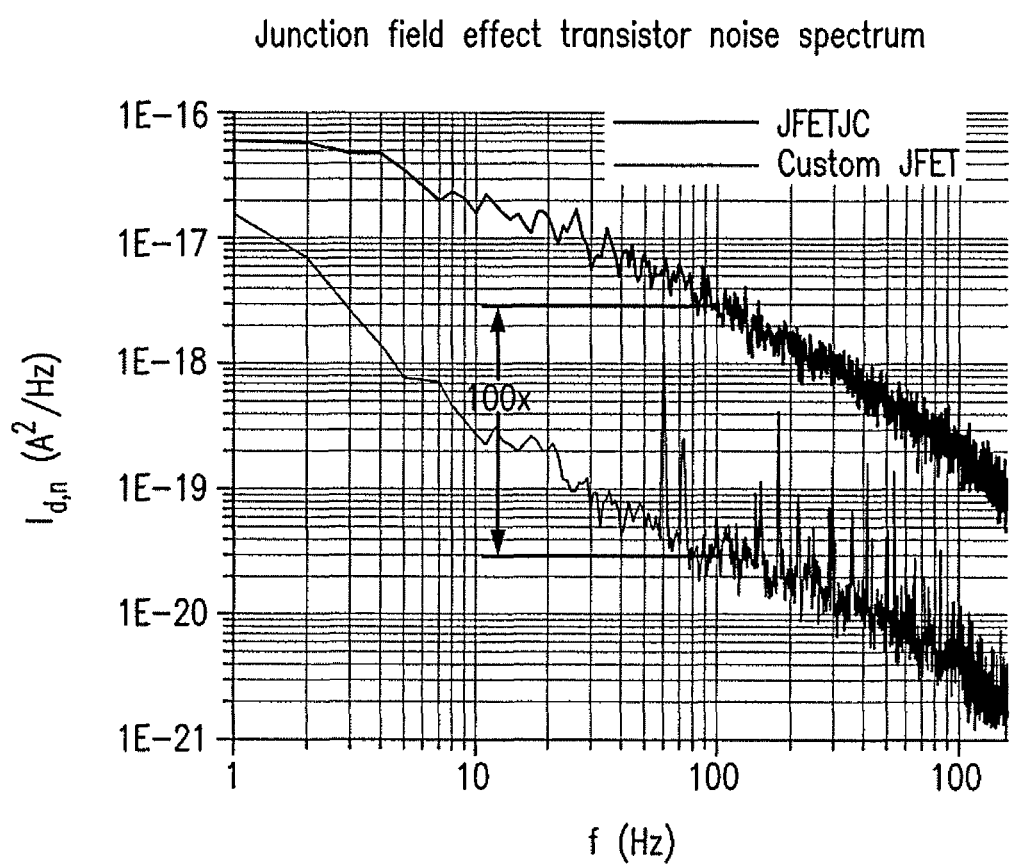
FIG. 5 is a diagram illustrating an exemplary JFET noise spectrum, as compared with an exemplary JFETJC noise spectrum.

The drain current flicker noise can be reduced by a factor of 100 or more in the exemplary JFET, as shown in FIG. 5. Although the blocking layer described herein is a PC blocking layer, any layer that effectively isolates the source, gate and drain surface conduction and breaks the salicide can be utilized, including for example and without limitation an OP mask which can function as a salicide block, for example when combined with BP2ND, a n+ and p+ dopant block mask.

Figure 6:
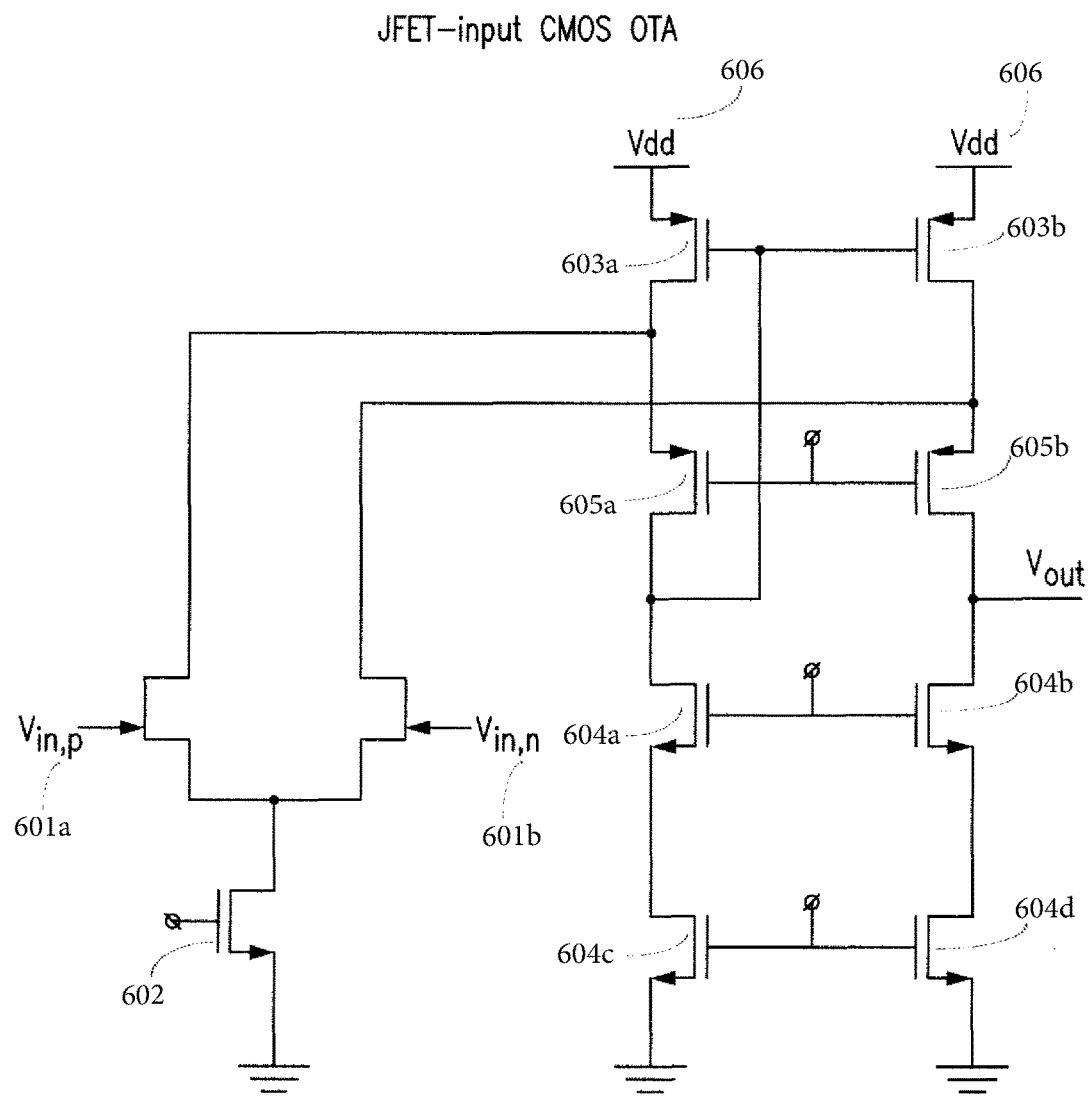
FIG. 6 is a diagram illustrating an exemplary JFET-input CMOS OTA.

According to another aspect of the disclosed subject matter, JFET devices described herein can allow for the design of a low-noise JFET-input, complementary metal oxide semiconductor (CMOS) operational transconductance amplifier (OTA), as shown for example in FIG. 6. FIG. 6 shows an exemplary folded cadcode OTA using JFET devices for the inputs 601 and 601*b*. Transistors 602, 603*a*, and 603*b* can supply the device bias current, and transistors 604*a* through 604*d* can act as an active load. Transistors 605 and 605*b* can function as the cascode devices, which can increase the output impedance of the amplifier, thereby increasing the gain. The Vdd voltage 606 can be raised to account for the depletion mode functioning of the JFET, as with the JFETJC. The JFET-CMOS OTA can form the basic building block for a number of circuits that can benefit from the JFET input stage. Without limitation to the OTA designs described herein, the JFET-CMOS devices can be used to decrease noise and capacitance for any OTA design. For example, the JFET-CMOS OTA can be used as an amplifier in a variety of small-signal current and voltage measurements.

A JFET-CMOS OTA can provide reduced flicker noise and input capacitance when compared with other CMOS OTAs. This reduced noise and capacitance can be suitable for low-noise transimpedance amplifier (TIA) applications.

Figure 7:
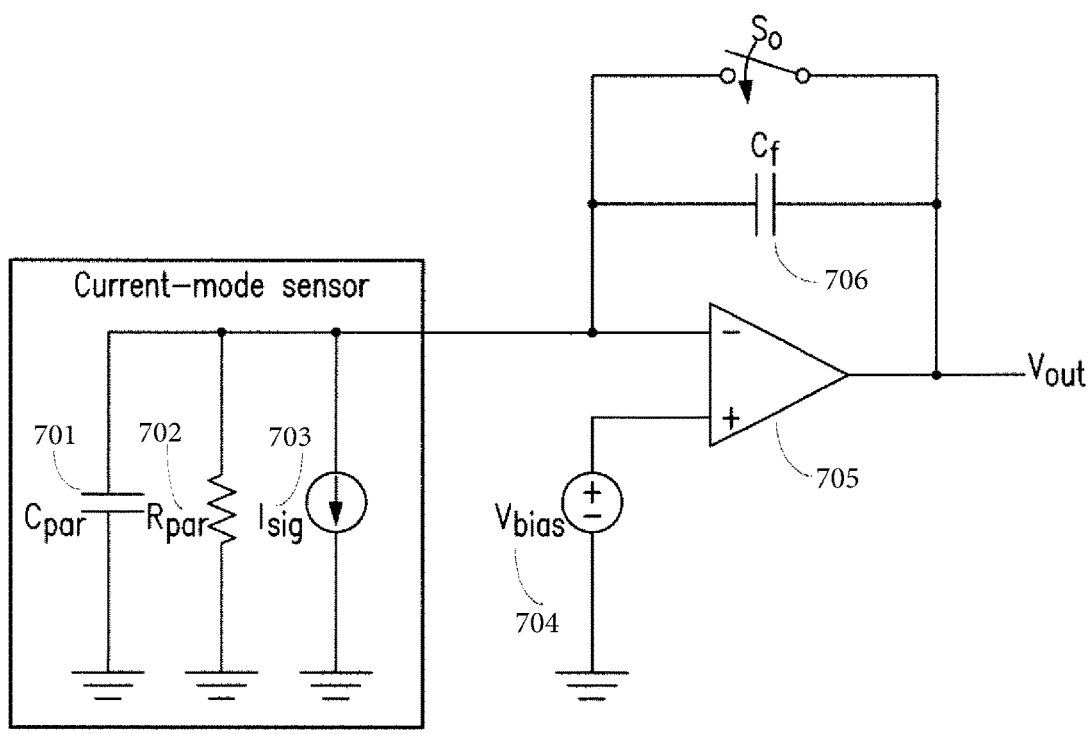
FIG. 7 is a diagram illustrating an exemplary current integrating amplifier utilizing JFET-CMOS OTA.

According to another aspect of the disclosed subject matter, a low-noise TIA utilizing JFET-CMOS OTAs described herein is shown for example in FIG. 7. $C_{par}$ 701 and $R_{par}$ 702 can represent parasitic capacitance and resistance associated with the physical structure of the connected current mode sensor. $I_{sig}$ can represent the signal current of the sensor which can vary based at least in part on the device function. $V_{bias}$ 704 can be a designer-set voltage, which can be chosen to allow for suitable functioning of the sensor based on that device's operating region. Op amp 705 can represent the JFET-input CMOS OTA building block. $C_F$ 706 can represent the feedback capacitance of the TIA, which can set the gain of the amplifier. The value of $C_F$ 706 can also vary based on the value of $I_{sig}$ 703. Typical values for $C_F$ 706 can be application-specific and thus can vary from about 10 fF to 50 pF. Such an integrating amplifier design can have applications in the measurement of biological and solid state nanopore sensors, nanogap sensors, and other current output sensors that utilize low-noise current measurement. The use of an integrated amplifier can allow for close integration with the sensors, reducing parasitic capacitances and electromagnetic interference. Arrays of these amplifiers can also be integrated on the same substrate.

Nanopore sensors can operate using detection of current changes in the picoamp regime. The current can indicate the blockade of the electrolytic conduction through the pore by the translocation of single molecules. Such techniques can be used to study many types of biomolecules, including DNA, RNA, and proteins. Such techniques can also be used for nanopore sequencing of DNA.

Nanogap sensors can also benefit from low-noise TIAs created with JFET input devices. Nanogap sensors can use electrochemical detection through repeated oxidation and reduction of analytes, and currents in the femtoampere range can be typical. These amplifiers can have voltage-clamp applications in electrophysiology.

Figure 8:
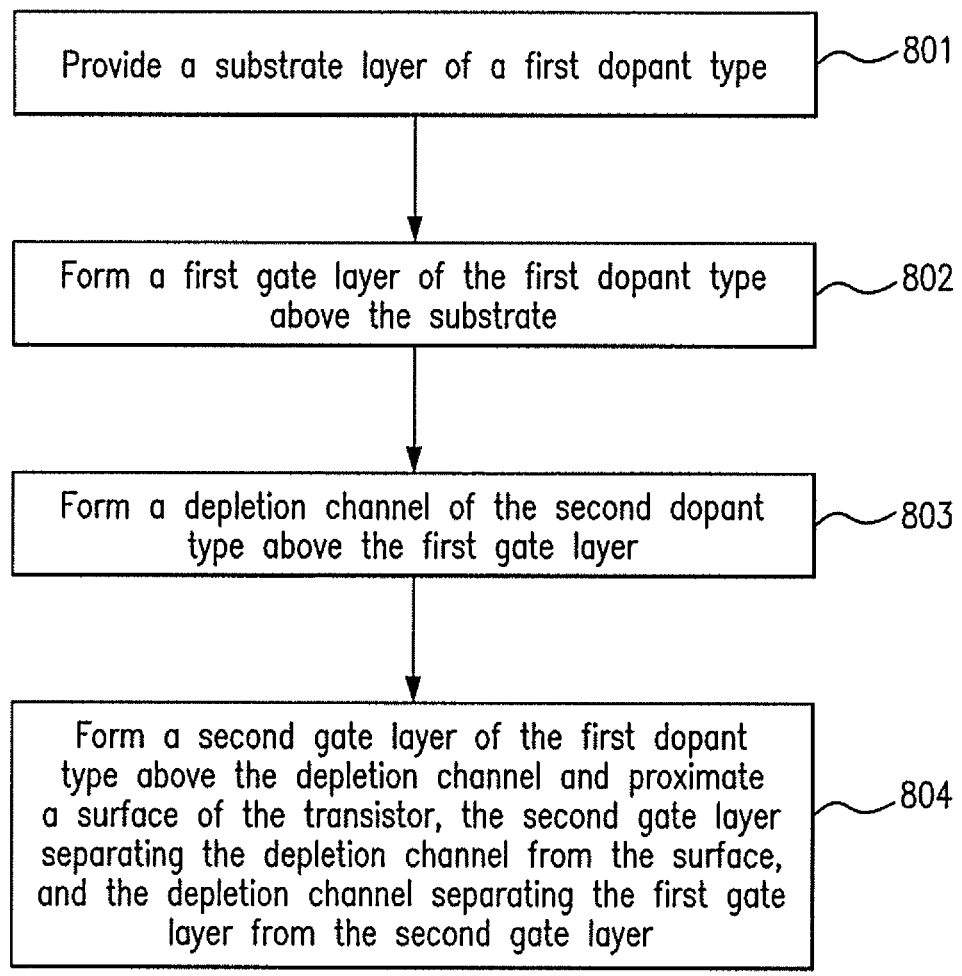
FIG. 8 is a diagram illustrating an exemplary method of making a junction field effect transistor according to the disclosed subject matter.

According to another aspect of the disclosed subject matter, a method for reducing noise in a JFET implemented in CMOS-technology is shown for example in FIG. 8. As shown in FIG. 8, at 801, a substrate of a first dopant type can be provided and, at 802, can have a second dopant type well deposited thereon. The well can be doped with the first dopant type to form the back gate contacts at 803. The back gate bottom of the first dopant type and channel of the second dopant type can be formed, along with the source and drain contacts at 804. The top gate can be formed at 805, for example, using the first dopant. Formation of the top gate can include deposition of the blocking layer as described herein.

The foregoing merely illustrates the principles of the disclosed subject matter. Various modifications and alterations to the described embodiments will be apparent to those skilled in the art in view of the teachings herein. It will thus be appreciated that those skilled in the art will be able to devise numerous techniques which, although not explicitly described herein, embody the principles of the disclosed subject matter and are thus within its spirit and scope.

The invention claimed is:

1. An integrated junction field effect transistor formed as a complementary metal oxide semiconductor, comprising:
   a substrate layer of a first dopant type;
   an isolation well of a second dopant type disposed above the substrate;
   a first gate layer of the first dopant type disposed above the isolation well;
   a depletion channel of the second dopant type disposed above the first gate layer;
   a second gate layer of the first dopant type disposed on the depletion channel and proximate a surface of the transistor, the second gate layer separating the depletion channel from the surface, and the depletion channel separating the first gate layer from the second gate layer; and
   a drain contact and a source contact, each disposed proximate the surface and in electrical communication with the depletion channel, wherein each of the source and drain contacts are disposed proximate and abut a layer formed between the second gate layer and each of the source and drain contacts and configured to reduce flicker noise.

2. The transistor as claimed in claim 1, wherein the isolation well of the second dopant type is disposed between and separating the substrate layer and the first gate layer.

3. The transistor as claimed in claim 1, further including shallow trench isolation between the second gate layer and each of the source and drain contacts.

4. The transistor as claimed in claim 1, wherein the first dopant type is P-type and the second dopant type is N-type.

5. The transistor as claimed in claim 1, wherein the first dopant type is N-type and the second open type is P-type.

6. A plurality of transistors as claimed in claim 1, configured as an array.

7. A method of making a junction field effect transistor using a complementary metal oxide semiconductor (CMOS) process, comprising:
   providing a substrate layer of a first dopant type;
   forming an isolation well of the second dopant type above the substrate;
   forming a first gate layer of the first dopant type above the isolation well;
   forming a depletion channel of the second dopant type above the first gate layer;
   forming a second gate layer of the first dopant type above the depletion channel and proximate a surface of the transistor, the second gate layer separating the depletion channel from the surface, and the depletion channel separating the first gate layer from the second gate layer;
   forming a drain contact and a source contact, each disposed proximate the surface and in electrical communication with the depletion channel; and
   forming a low doping layer between the second gate layer and each of the source and drain contacts, wherein the low doping layer is disposed proximate and abuts each of the source and drain contacts and is configured to reduce flicker noise.

8. A method of making the transistor as claimed in claim 7, wherein an isolation well of the second dopant type is disposed between and separating the substrate layer and the first gate layer.

9. A method of making the transistor as claimed in claim 7, wherein the transistor is formed using a 180 nm process.

10. A method of making the transistor as claimed in claim 7, wherein the first dopant type is P-type and the second dopant type is N-type.

11. A method of making the transistor as claimed in claim 7, wherein the first dopant type is N-type and the second open type is P-type.

12. A method of making the plurality of transistors as claimed in claim 7, configured as an array.

13. The transistor of claim 1, wherein the low doping layer comprises polysilicon.

14. The transistor of claim 1, wherein the low doping layer comprises an ohmic contact pattern (OP) mask.

* * * * *

UNITED STATES PATENT AND TRADEMARK OFFICE
CERTIFICATE OF CORRECTION

PATENT NO. : 9,741,870 B2  
APPLICATION NO. : 14/681753  
DATED : August 22, 2017  
INVENTOR(S) : Kenneth L. Shepard et al.

Page 1 of 1

It is certified that error appears in the above-identified patent and that said Letters Patent is hereby corrected as shown below:

In the Specification

STATEMENT REGARDING FEDERALLY SPONSORED RESEARCH:

Column 1 Line 18:
"This invention was made with government support under Award No. R33-HG003089 awarded by the National Institute of Health. The government has certain rights in the invention."

Should read:
-- This invention was made with government support under grant HG003089 awarded by the National Institutes of Health. The Government has certain rights in this invention. --

Signed and Sealed this
Fourteenth Day of November, 2017

Joseph Matal
*Performing the Functions and Duties of the*
*Under Secretary of Commerce for Intellectual Property and*
*Director of the United States Patent and Trademark Office*